(12) United States Patent
Yuasa et al.

(10) Patent No.: US 7,237,606 B2
(45) Date of Patent: Jul. 3, 2007

(54) WAFER SUPPORTER

(75) Inventors: Mitsuhiro Yuasa, Tokyo (JP); Keiichi Enjoji, Tokyo (JP); Koji Homma, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 499 days.

(21) Appl. No.: 10/480,460

(22) PCT Filed: Jun. 12, 2002

(86) PCT No.: PCT/JP02/05867

§ 371 (c)(1),
(2), (4) Date: Dec. 12, 2003

(87) PCT Pub. No.: WO02/103781

PCT Pub. Date: Dec. 27, 2002

(65) Prior Publication Data

US 2004/0188020 A1 Sep. 30, 2004

(30) Foreign Application Priority Data

Jun. 14, 2001 (JP) .............................. 2001-180083

(51) Int. Cl.
*F28F 7/20* (2006.01)
*F28D 15/00* (2006.01)

(52) U.S. Cl. ...................... 165/185; 165/80.2

(58) Field of Classification Search ................ 165/185, 165/80.1, 80.2, 905–906; 361/704–705, 361/707; 257/706–707, 712, 720, 796; 438/106–107, 438/110, 113, 121, 125; 206/454, 701, 711, 206/719, 722; 29/25.01, 25.03; 269/287, 269/903; 428/172, 195, 611
See application file for complete search history.

(56) References Cited

U.S. PATENT DOCUMENTS

| 4,256,792 A * | 3/1981 | Koepke et al. ............. 428/119 |
| 5,660,917 A * | 8/1997 | Fujimori et al. ......... 428/195.1 |
| 5,872,051 A * | 2/1999 | Fallon et al. ................ 438/616 |
| 5,919,332 A * | 7/1999 | Koshiishi et al. ........ 156/345.47 |
| 6,001,180 A * | 12/1999 | Inoue ............................ 118/500 |
| 6,019,164 A * | 2/2000 | Getchel et al. ............. 165/80.1 |
| 6,451,418 B1* | 9/2002 | Tobita ....................... 428/297.4 |

FOREIGN PATENT DOCUMENTS

| EP | 0470386 | 2/1992 |
| EP | 0732728 | 9/1996 |
| JP | 6231860 | 2/1987 |
| JP | 62-076146 | 4/1987 |

(Continued)

*Primary Examiner*—Tho Duong
(74) *Attorney, Agent, or Firm*—Crowell & Moring LLP

(57) ABSTRACT

A wafer supporting unit (10) includes a base (12) and a thermally conductive member (14). The base is formed by nickel material. The thermally conductive member is formed in the shape of a lamina, includes silicone rubber (16) serving as the main material, and Ag fine powder (18) is blended with the silicone rubber. The Ag fine powder is blended with high density in part of the thermally conductive member, and a plurality of pillar-shaped regions (20) is formed with one end facing the bottom, and with the other end facing the top. The wafer supporting unit does not produce curvature in a wafer, and provides efficient cooling of the wafer, and does not cause heat degradation in a thermally conductive member prepared on the rear side of the wafer during processing.

14 Claims, 6 Drawing Sheets

| | FOREIGN PATENT DOCUMENTS | | JP | 10050665 | 2/1998 |
|---|---|---|---|---|---|
| | | | JP | 2000-058473 | 2/2000 |
| JP | 1115255 | 8/1989 | JP | 2000-185328 | 7/2000 |
| JP | 05121530 A * | 5/1993 | JP | 2000-228471 | 8/2000 |
| JP | 06338560 | 12/1994 | | | |
| JP | 07058041 | 3/1995 | * cited by examiner | | |

WAFER SUPPORTER

BACKGROUND OF THE INVENTION

1. Field of the Invention

The present invention generally relates to a wafer supporting unit, and especially relates to a wafer supporting unit for supporting and handling a thin-layer like wafer in a manufacturing process of semiconductor devices.

2. Description of the Related Art

In the manufacturing process of semiconductor devices, a wafer is supported (or held) by a wafer supporting unit (or a wafer holder), and conveyed between processes.

For example, at a back grind process, the rear side of the wafer is ground until the wafer becomes like a thin layer having thickness of about 200 micrometers or less, before the wafer is diced into chips. At this juncture, the thin-layer like wafer is often conveyed to the next process with a protective tape attached for back grinding, is placed on a metal stand and the like, and is diced.

Further, since the temperature of the wafer rises during an ion implantation process, thermally conductive material, such as silicone rubber, is attached on the supporting unit, and the wafer is arranged on the thermally conductive material such that the heat of the wafer is dissipated to the supporting unit. Further, since the thermal conductivity of the thermally conductive material, such as the silicone rubber, is insufficient, a metal porous material with its holes filled with silicone rubber is being studied as a heat transfer object for the wafer supporting unit (JP 62-76146, A). In this case, it is claimed that the thermal conductivity of the heat transfer object is improved, and that the heat transmission characteristics are improved by enhancing adhesion of a wafer to the heat transfer object, improving the total heat transfer.

However, in the former case of the conventional technologies, where only the protective tape is attached to the wafer, the thin-layer like wafer, the mechanical strength of which is degraded, tends to become curved, possibly causing trouble in handling. Further, when processing the wafer, if the wafer with the protective tape is curved on the metal stand, the heat transfer from the wafer to the metal stand is degraded, the wafer cannot be sufficiently cooled, and the protective tape is exposed to a high temperature, quickly causing degradation.

In the latter case, where the heat conduction object is attached to the supporting unit, cooling of the wafer is still not satisfactory.

In view of the above-mentioned problems, the present invention aims at offering a wafer supporting unit that does not produce curvature in the wafer at the time of handling, efficiently cools the wafer by efficiently transferring the heat of the wafer on the wafer supporting unit at the time of wafer processing, and does not thermally degrade the thermally conductive material prepared on the rear side of the wafer side.

SUMMARY OF THE INVENTION

The wafer supporting unit according to the present invention includes a thermally conductive member, mainly consisting of thermally conductive rubber, arranged on a base, and a wafer that is placed on the thermally conductive member, wherein the thermally conductive member is characterized by including pillar-shaped regions consisting of a high density composition of a thermally conductive granular material such that both sides (wafer placement side and base facing side) of the thermally conductive member are thermally connected.

Here, the wafer supporting unit refers to an article that supports (holds) a wafer during conveyance of the wafer between processes, and during a process wherein the wafer is processed. Here, although the thermally conductive rubber is not especially limited to a specific rubber so long as the rubber has high thermal conductivity, a silicone rubber that provides good adhesiveness is desirable in order to obtain high adhesion with the wafer protective tape. Further, although the thermally conductive granular material is not especially limited to a specific granular material so long as the granular material has high thermal conductivity, fine granules of metal and carbon are desirable. As for the metal, Ag, Cu, etc., are desirable. After blending the granular material with the thermally conductive rubber in a fusion state, the granular material is distributed, forming the pillar-shaped regions at high density in the thermally conductive rubber. In this manner, the pillar-shaped regions are obtained serving as efficient heat transfer paths that connect the wafer placement side and the base side.

Further, the wafer supporting unit according to the present invention is characterized by the thermally conductive rubber of the thermal conductivity member containing a thermally conductive fiber material.

Here, although the thermally conductive fiber material is not especially limited to a specific fiber material so long as the fiber material has high thermal conductivity, a metal fiber material and carbon fiber material are desirable.

In this case, it is desirable that the thermally conductive member have a high density composition of the thermally conductive fiber material so that the pillar-shaped regions connecting the wafer placement side and the base side are formed in the thermally conductive rubber.

Since the wafer supporting unit according to the present invention is configured by the thermally conductive member and the base as described above, proper handling is provided with no curvature being produced in the wafer, the curvature being the problem with the conventional practice wherein the wafer is handled only with a protective tape attached to the wafer. Further, since the thermally conductive member contains one of the thermally conductive granular material and the thermally conductive fiber material in the thermally conductive rubber, the heat of the water at the time of wafer processing can be dissipated to the wafer supporting unit more efficiently than the conventional practice wherein only a thermally conductive rubber is used; accordingly, the wafer is efficiently cooled, and the thermal degradation of the thermally conductive member prepared on the bottom side of the wafer is prevented from occurring.

Further, the wafer supporting unit according to the present invention is characterized by containing one of the thermally conductive granular material and the thermally conductive fiber material with density variation in a direction on the water placement side of the thermally conductive rubber of the thermally conductive member corresponding to the radius direction of the wafer.

By the above-mentioned configuration, according to the present invention, the cooling effect of the perimeter portion, for example, of the thermal conductivity member where the heat transfer efficiency is low because the thermally conductive material does not exist, is improved by providing one of the thermally conductive granular material and the thermally conductive fiber material at high density, resulting in high and uniform thermal conduction of the entire thermally conductive member.

Further, if the thermally conductive member is produced such that the thermally conductive granular material and the thermally conductive fiber material are not exposed at the surface of the thermally conductive rubber on the wafer placement side, good adhesion with the wafer can be obtained because only the thermally conductive rubber having good adhesiveness touches the wafer. In this manner, the wafer can be cooled more efficiently and the wafer can be reliably supported by the wafer supporting unit.

Further, the wafer placement side of the thermal conductivity member of the wafer supporting unit according to the present invention is shaped like a circular disk, and the diameter of the thermal conductivity member is set smaller than the diameter of the wafer by an amount greater than a placement error that is a positioning error when the wafer is placed on the thermal conductivity member.

For example, in the case of a wafer having a diameter of 200 mm, the placement error (conveyance error, arrangement error) is set at 2 mm, which is equivalent to 1% (±0.5%) of the wafer diameter; and the diameter of the thermally conductive member is set at 198 mm.

In this manner, the thermally conductive member is prevented from deteriorating when a processing material, such as an etching material, is applied during wafer processing, because the rim of the thermally conductive member is not exposed beyond the rim of the wafer, even if there is a placement error.

Further, the wafer supporting unit according to the present invention is characterized by the base, made from a metal, having a concavity that is cylindrical in shape; and the thermally conductive member and the wafer are arranged in the concavity.

In this manner, according to the present invention, the side of the wafer and the thermally conductive member are protected from plasma or radicals when a process, such as plasma etching, reactive ion etching, spatter etching, and the like, is performed on the wafer.

Here, the base can also be protected from the plasma or the radicals if the surface of the base is covered with a ceramic material, the surface being at least the part where the above-mentioned thermally conductive member is not placed.

Here, ceramic material refers to ceramics in a wide sense, and, for example, alumina and the like are desirable. Further, as for covering methods, an adhesive method and a coating method and the like can be used; when, for example, alumina is used, a thermal-spraying method is desirable as the covering method.

Further, in the present invention, a predetermined dimension of the base serves different dimensions of the thermally conductive members that correspond to different dimensions of wafers. In this manner, when the wafers in various dimensions placed on corresponding thermally conductive members, having different dimensions, are handled by the wafer supporting unit, since the base is formed in the same predetermined dimension, the same conveyance apparatus, fixing apparatus and the like can be used for the various dimensions of the wafers, thereby the conveyance apparatus, fixing apparatus and the like do not have to be duplicated.

Further, the wafer supporting unit according to the present invention is provided with an identification mark that stores predetermined information.

The predetermined information stored by the identification mark includes information about the wafer supporting unit (tray ID) including the identification of the wafer supporting unit. As information other than the identification of the wafer supporting unit, information about a processing wafer, a process, and the like can be stored as desired.

By the above-mentioned configuration of the present invention, contamination, for example, of the wafer supporting unit can be adequately managed such that the wafer is prevented from being contaminated by a substance adhering to the wafer supporting unit.

Figure 7:
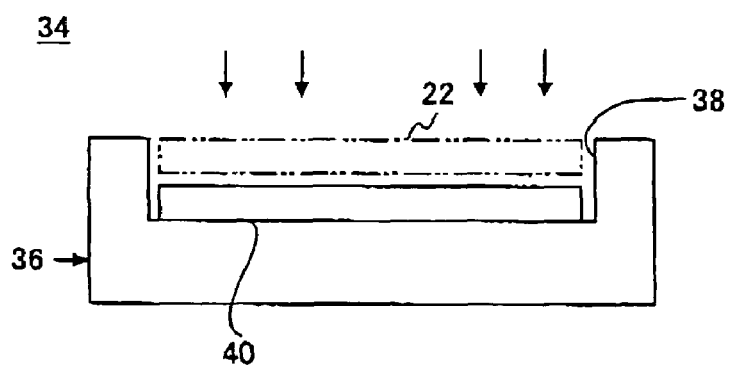
Figure 8:
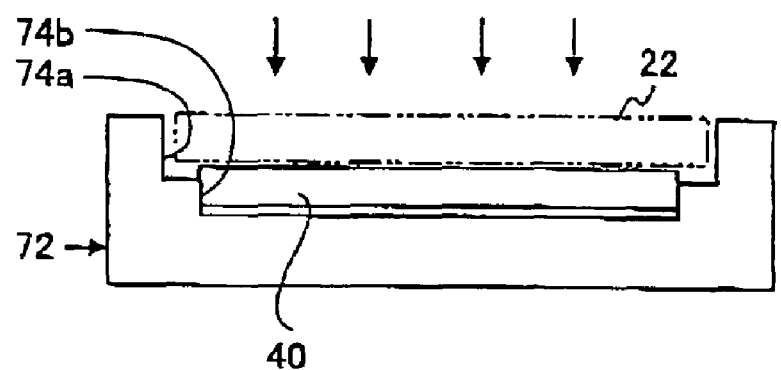
Figure 9:
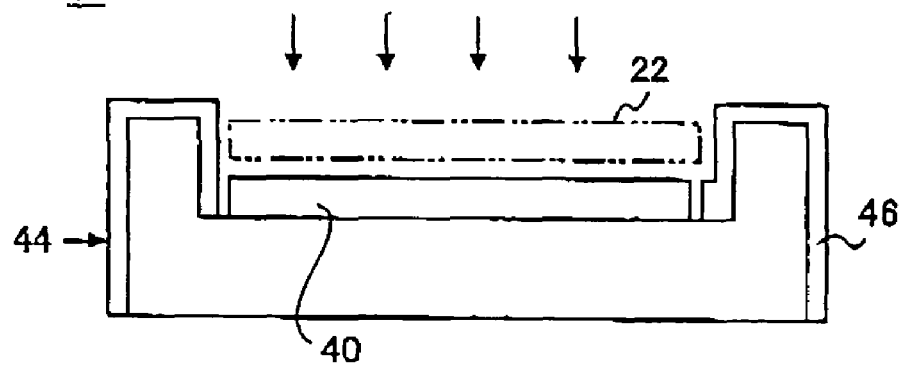
Figure 10A:
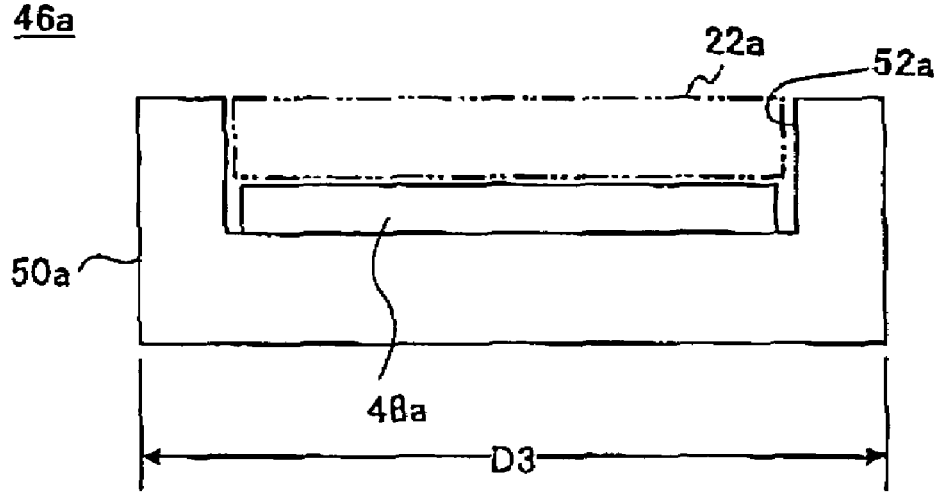
Figure 10B:
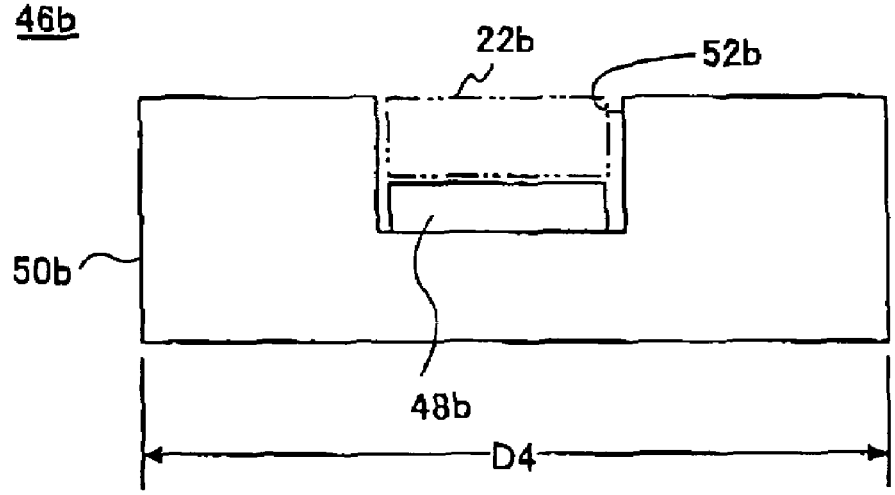
Figure 11:
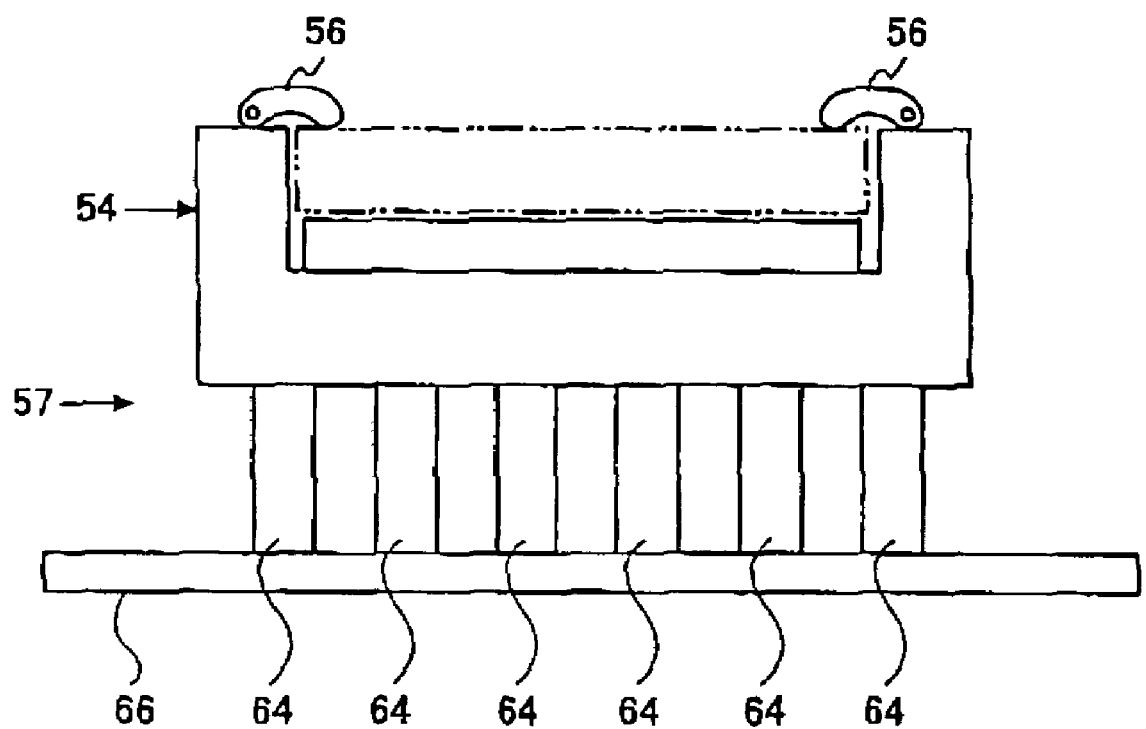

View 6B is another schematic diagram showing a state where the wafer position is shifted downward against the wafer supporting unit;

FIG. 7 is a cross-sectional view of the wafer supporting unit according to a fifth embodiment of the present invention;

FIG. 8 is a cross-sectional view of the wafer supporting unit according to a sixth embodiment of the present invention;

FIG. 9 is a cross-sectional view of the wafer supporting unit according to a seventh embodiment of the present invention;

FIG. 10A is a cross-sectional view for explaining the wafer supporting unit according to an eighth embodiment of the present invention, showing the case where the diameter of the wafer is large;

FIG. 10B is another cross-sectional view showing the case where the diameter of the wafer is small; and FIG. 11 is a cross-sectional view for explaining a fixing method of the wafer supporting unit according to the present invention, and shows the wafer supporting unit and a magnetic chuck.

DESCRIPTION OF THE PREFERRED EMBODIMENTS

Preferred embodiments of the wafer supporting unit according to the present invention are explained below with reference to the attached drawings.

Figure 1:
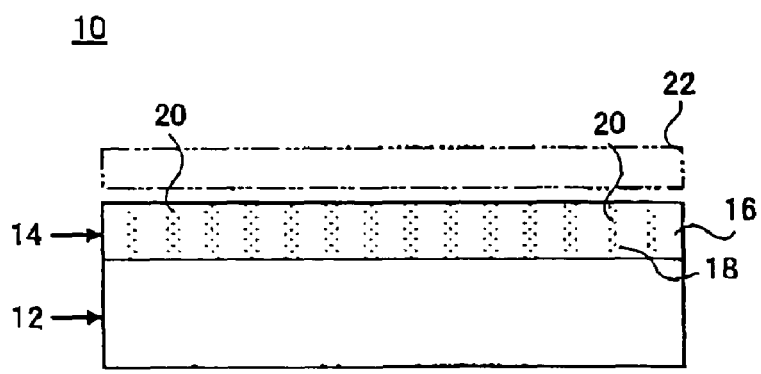
FIG. 1 shows a cross-sectional view of the wafer supporting unit according to the first embodiment of the present invention, wherein how thermally conductive granular material is typically distributed in a thermally conductive member is shown.

The first embodiment of the present invention of the wafer supporting unit is explained with reference to FIG. 1.

A wafer supporting unit 10 includes a base 12 and a thermally conductive member 14 provided on the base 12.

The base 12 is made from a metal, e.g., nickel, and is formed into a board-like or a disk-like shape having a thickness that ranges from 0.3 mm to 3 mm.

The thermally conductive member 14 is mainly made from thermally conductive rubber, such as silicone rubber 16 that contains Ag fine powder 18, the thickness of the thermally conductive rubber ranging from 0.05 mm to 3 mm and being shaped like a thin plate.

Here, the silicone rubber 16 is made from dimethyl dichloro silane, and a forming process is performed after the Ag fine powder 18 is added. In this manner, two or more pillar-shaped regions 20 where the Ag fine powder 18 is distributed at high density are formed in the silicone rubber 16, as shown in FIG. 1, one end of each pillar-shaped region 20 facing upward, and the other facing downward.

A wafer 22, to which a protective tape that is not illustrated is attached, is placed on the wafer supporting unit 10. The wafer 22 is fixed to the wafer supporting unit using, for example, a fixing member, or alternatively, the wafer 22 is adsorbed and fixed by an adsorption mechanism (not shown) that is provided in the wafer supporting unit 10. The wafer 22 fixed to the wafer supporting unit 10 is processed, and then conveyed to the next process.

Since the wafer supporting unit according to the first embodiment of the present invention includes the thermally conductive member and the base, curvature is not generated in the wafer, while the conventional practice of handling the wafer with only a protective tape attached to the wafer generates curvature in the wafer. In this manner, handling is improved. Further, since the thermally conductive member includes the thermally conductive rubber that contains the thermally conductive granular material, dissipation of the heat of the wafer at the time of wafer processing is more efficient than the conventional practice that uses only a thermally conductive rubber. Accordingly, the wafer is efficiently cooled, and degradation of the thermally conductive member and the protective tape due to the heat is prevented from occurring.

Two variations of the wafer supporting unit 10 of the first embodiment of the present invention are explained below with reference to FIG. 2 and FIG. 3.

Figure 2:
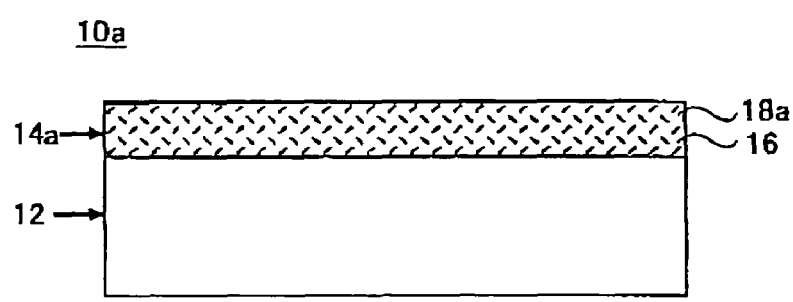
FIG. 2 shows a cross-sectional view of the wafer supporting unit according to the first variation of the first embodiment of the present invention, wherein how thermally conductive fiber material is typically distributed in a thermally conductive member is shown.

A wafer supporting unit 10a of the first variation shown in FIG. 2 includes a thermally conductive member 14a that further includes the silicone rubber 16 in which Ag metal fibers 18a are distributed, which is the difference from the wafer supporting unit 10 of the first embodiment of the present invention.

Figure 3:
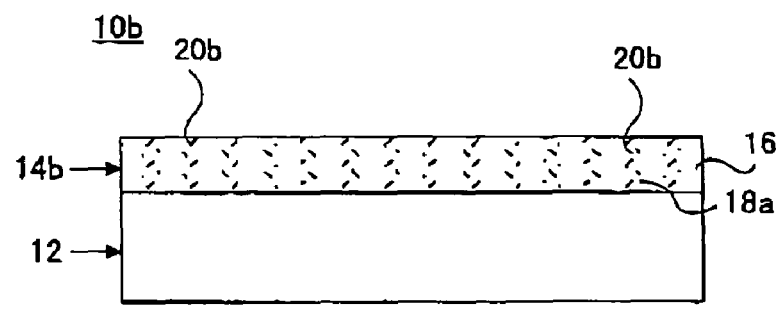
FIG. 3 shows a cross-sectional view of the wafer supporting unit according to the second variation of the first embodiment of the present invention, wherein how thermally conductive fiber material is typically distributed in a thermally conductive member is shown.

Further, a wafer supporting unit 10b of the second variation shown in FIG. 3 includes a thermally conductive member 14b that further includes the silicone rubber 16 in which the Ag metal fibers 18a of the first variation are distributed with varied density from place to place, and pillar-shaped regions 20b like the case of the first embodiment of the present invention are formed, which is different from the first variation.

Since the thermal conductors of the wafer supporting units 10a and 10b of the first and the second variation, respectively, are more continuous, higher thermal conductivity is obtained, compared with the wafer supporting unit 10 of the first embodiment of the present invention.

Figure 4A:
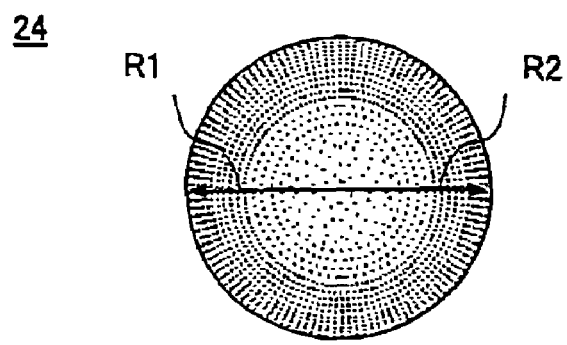
FIG. 4A is a plan view of the wafer supporting unit according to a second embodiment of the present invention, and for explaining the wafer supporting unit.
Figure 4B:
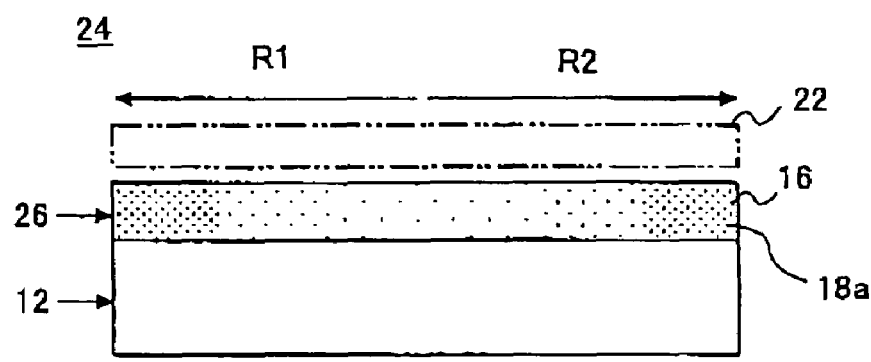
FIG. 4B shows a cross-sectional view of the wafer supporting unit of the second embodiment, wherein how thermally conductive granular material is typically distributed in the thermally conductive member is shown.

Next, the wafer supporting unit according to the second embodiment of the present invention is explained with reference to FIGS. 4A and 4B.

A wafer supporting unit 24 of the second embodiment of the present invention is configured basically the same as the first embodiment of the present invention, and the first and second variations thereof.

A thermally conductive member 26 of the wafer supporting unit 24 contains the Ag fine powder 18 that is the same as the first embodiment of the present invention as the thermally conductive granular material. However, in the present embodiment, the Ag fine powder 18 is distributed such that density thereof becomes higher in the outer portion than the inner portion in the direction corresponding to the radius (as indicated by arrows marked by R1 and R2 in FIG. 4A) of the wafer 22 that is placed. The density being varied is the difference from the first embodiment and the like of the present invention.

The wafer supporting unit 24 of the second embodiment of the present invention provides uniform heat conductivity for the entire surface of the wafer, since the thermally conductive granular material or the thermally conductive fiber material is provided at higher density at the perimeter portion than at the inner portion, given that, otherwise, the perimeter part of the wafer supporting unit 24 tends to have a low heat transfer rate because, for example, there are no heat transfer paths outside of the perimeter.

In addition, in the case when cooling is to be improved at the inner portion of the wafer, the density variation of the Ag fine powder 18 is made reverse to the second embodiment of the present invention, i.e., the density is made higher in the inner portion than the perimeter portion.

Further, the Ag fine powder 18 used by the wafer supporting unit 24 of the second embodiment of the present invention may be replaced with the Ag metal fiber 18a used by the first and the second variations of the first embodiment of the present invention.

Figure 5:
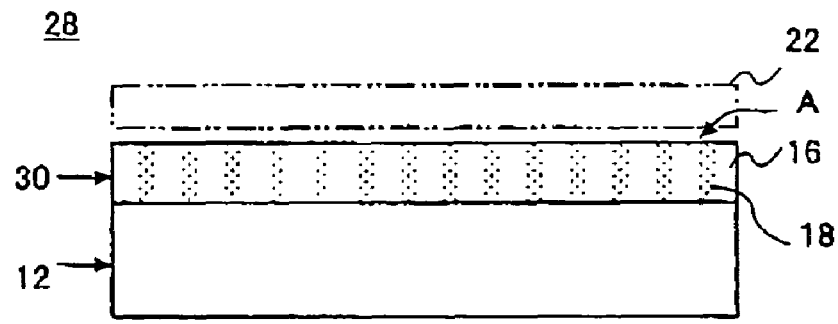
FIG. 5 is a cross-sectional view of the wafer supporting unit according to a third embodiment of the present invention, wherein how thermally conductive granular material is typically distributed in the thermally conductive member is shown.

Next, the wafer supporting unit according to the third embodiment of the present invention is explained with reference to FIG. 5.

A wafer supporting unit 2B of the third embodiment of the present invention is basically the same as the wafer supporting unit 10 of the first embodiment of the present invention, and the like. For example, the embodiment of the present invention shown in FIG. 5 is almost the same as the first embodiment of the present invention.

However, in the present embodiment, as for the wafer supporting unit 28, the Ag fine powder 18 distributed in the thermally conductive member 30 is not exposed to the surface (section A in FIG. 5) that is the placement surface for the wafer 22 of the silicone rubber 16.

Here, the Ag fine powder 18 may be replaced by Ag metal fiber 18a.

The wafer supporting unit 28 of the third embodiment of the present invention provides satisfactory adhesion with the wafer 22 because only the silicone rubber 16, which has good adhesiveness, touches the wafer 22. In this manner, the thermal conductivity from the wafer 22 to the thermally conductive member 30 is improved, and fixation of the wafer 22 to the wafer supporting unit 28 by the adsorbing method, etc., can be ensured. Further, even when a protective tape is not prepared, the wafer is not subjected to damage either from the Ag fine powder 18 or the Ag metal fiber 18a.

Next, the wafer supporting unit according to the fourth embodiment of the present invention is explained with reference to FIGS. 6A and 6B.

A wafer supporting unit 30 of the fourth embodiment of the present invention is basically the same as the first embodiment of the present invention, and the like.

The wafer placement side of the thermally conductive member 32 of the wafer supporting unit 30 is formed in the shape of a circle. In the cases shown in FIGS. 6A and 6B, the base side of the thermally conductive member 32 is also formed in the shape of a circle, and the entire thermally conductive member 32 is formed in the shape of a circular sheet.

Further, a diameter D1 of the thermally conductive member is set smaller than a diameter D2 of the wafer 22 by an amount that is equal to or greater than the placement error, which is a positioning error when placing the wafer 22 on the thermally conductive member 32.

For example, if the error when conveying and placing the wafer 22 that has the diameter D2 of 200 mm on the wafer supporting unit 30 of an apparatus is given as 1% (i.e., 0.5% each side), the diameter D1 of the thermally conductive member 32 is set at, e.g., 198 mm.

Figure 6A:
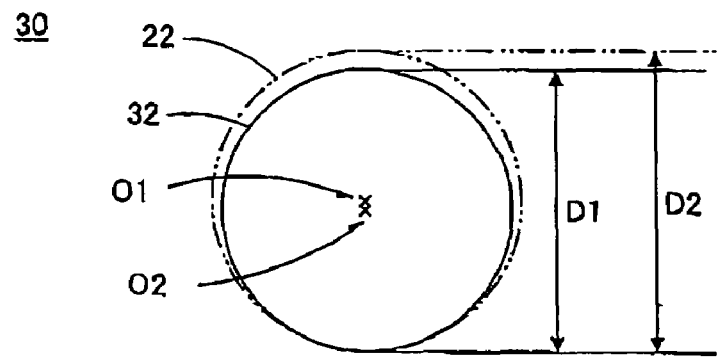
FIG. 6A is a schematic diagram for explaining the wafer supporting unit according to a fourth embodiment of the present invention, showing a state where the wafer position is shifted upward against the wafer supporting unit.

As for the wafer supporting unit 30 of the fourth embodiment of the present invention: when the wafer 22, the center of which is O1, is placed on the thermally conductive member 32, the center of which is O2, and O1 is shifted upward by 1 mm in reference to O2, as shown in FIG. 6A (in other words, the upper rim of the wafer 22 is 2 mm beyond the thermally conductive member 32), the upper part of the thermally conductive member 32 is covered by the wafer 22 with margins; and the lower part of the thermally conductive member 32 is still covered by the wafer 22, and is not exposed.

Figure 6B:
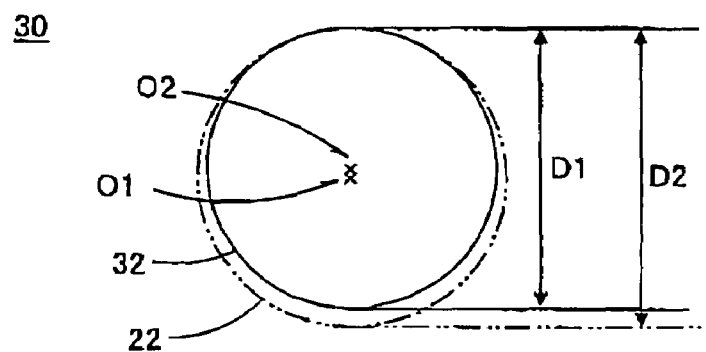

Conversely, if the center O1 of the wafer 22 is shifted downward by 1 mm in reference to the center O2 of the thermally conductive member 32, the same as above applies as shown in FIG. 6B.

As described above, even if there is a positioning error in placing the wafer 22 on the wafer supporting unit 30, the thermally conductive member 32 is not exposed beyond the periphery of the wafer 22, and the thermally conductive member 32 is protected from etching material, etc., being directly applied thereto in wafer processing.

Next, the wafer supporting unit according to the fifth embodiment of the present invention is explained with reference to FIG. 7.

A wafer supporting unit 34 of the fifth embodiment of the present invention is basically the same as the first embodiment of the present invention, and the like.

As for the wafer supporting unit 34, a base 36 is formed by a metal, for example, nickel. Further, a concavity 38 is formed in a cylindrical shape in the upper part of the base 36.

In the concavity 38, a thermally conductive member 40 is arranged, and further, the wafer 22 is arranged on the thermally conductive member 40 such that the wafer 22 is accommodated in the concavity 38. In other words, the side of the wafer 22 and the thermally conductive member 40 are dropped into the concavity 38 of the base 36.

By using the wafer supporting unit 34 of the fifth embodiment of the present invention, the base 36 serves as a protection wall for the side of the wafer 22 and the thermally conductive member 40 from plasma and radicals that are applied to the wafer 22 from above when performing wafer processing by plasma etching, reactive ion etching, spatter etching, etc.

Next, the wafer supporting unit according to the sixth embodiment of the present invention is explained with reference to FIG. 8.

A wafer supporting unit 70 of the sixth embodiment of the present invention is almost the same as the fifth embodiment of the present invention.

The difference is that that a base 72 is formed with a concavity, which is provided to the upper part of the base 72, including a first concavity 74a having a relatively large diameter, and a second concavity 74b having a relatively small diameter, i.e., there is a level difference. In other words, the wafer supporting unit 70 has a two-step tray-like structure that is different from the wafer supporting unit 42 of the fifth embodiment of the present invention. Then, the thermally conductive member 40 is completely buried in the second concavity 74b, and the wafer 22, which is larger than the thermally conductive member 40, is placed in the first concavity 74a on the thermally conductive member 40.

The wafer supporting unit 70 according to the sixth embodiment of the present invention provides protection that is higher than the fifth embodiment of the present invention to the thermally conductive member 40, since the side of the thermally conductive member 40 is protected by the base 72 while the upper surface is covered by the wafer 22.

Next, the wafer supporting unit according to the seventh embodiment of the present invention is explained with reference to FIG. 9.

A wafer supporting unit 42 of the seventh embodiment of the present invention is basically the same as the fifth embodiment of the present invention.

The difference from the fifth embodiment is that a part of a base 44 of the wafer supporting unit 42 of the seventh embodiment is covered by a ceramic material 46, the part being the surface that is not covered by the thermally conductive member 40. In this case, thermal spraying of alumina serving as the ceramic material 46 is carried out on the surface of the base 44.

Since the surface of the base 44 made of a metal is covered by the ceramic material 46, the base 44 of the wafer supporting unit 42 according to the seventh embodiment of the present invention is also protected from plasma and radicals. Here, the undersurface of the base 44 does not have to be covered with the ceramic material 46, since the base 44 is usually placed on other apparatuses such as a cooling device, and there is no possibility of plasma and radicals directly colliding with the undersurface.

Next, the wafer supporting unit according to the eighth embodiment of the present invention is explained with reference to FIGS. 10A and 10B.

The wafer supporting unit of the eighth embodiment of the present invention is basically the same as that of the seventh embodiment, for example, of the present invention.

However, according to the eighth embodiment, the size of the base is common at a predetermined dimension to different sizes of the thermally conductive member that is prepared for wafers in different sizes.

For example, a wafer supporting unit 46a shown in FIG. 10A is prepared for a wafer 22a having a diameter of 12 inches, the thermally conductive member 48a being formed with a diameter that is equal to or slightly less than the diameter of the wafer 22a. The wafer 22a and the thermally conductive member 48a are accommodated in a concavity 52a prepared in a base 50a, the concavity 52a having a diameter corresponding to the diameter of the thermally conductive member 48a and the wafer 22a. On the other hand, a wafer supporting unit 46b shown in FIG. 10B is prepared for a wafer 22b having a diameter of 4 inches, the thermally conductive member 48b being formed with a diameter that is equal to or slightly less than the diameter of the wafer 22b. The wafer 22b and the thermally conductive member 48b are accommodated in a concavity 52b prepared in a base 50b, the concavity 52b having a diameter corresponding to the diameter of the thermally conductive member 48b and the wafer 22b. Here, dimensions D3 and D4 of the bases 50a and 50b, respectively, i.e., outer diameters, are made the same.

According to the eighth embodiment of the present invention, the wafer supporting units 46a and 46b for handling wafers of different sizes have the same outer dimension, thereby the wafers of different sizes can be handled by the same conveyance apparatus, fixing apparatus and the like, without need for preparing a plurality of conveyance apparatuses, fixing apparatuses and the like.

Next, a fixing method for fixing a wafer to a wafer supporting unit is explained with reference to FIG. 11.

A wafer supporting unit 54 is configured like the wafer supporting unit 46a of the eighth embodiment of the present invention. However, according to the present embodiment, the wafer 22 is fixed to the wafer supporting unit 54 by fixing units 56 that can rotate. Here, the wafer 22 may be fixed to the wafer supporting unit 54 using an adhesion sheet, without preparing the fixing units 56.

The wafer supporting unit 54 that supports the wafer 22 is arranged on a magnetic chuck 57. The magnetic chuck 57 includes two or more stick-like permanent magnets 64 and a vertical drive 66. In this manner, the wafer supporting unit 54 is firmly fixed to the magnetic chuck 57 by the magnetic force of the stick-like permanent magnets 64.

Next, a management method of the wafer supporting unit is described, where the wafer supporting unit is repeatedly used.

When the wafer 22 mounted on the wafer supporting unit 54 is processed, a part of the etching agent, etching remnants, etc., remains. Although the amount of the residue in one processing is minute, contamination substances, such as an etching agent, adhering to the wafer supporting unit 54 are accumulated if processing of the wafer 22 is repeated many times, and result in an amount that cannot be disregarded in handling the wafer 22. For this reason, the wafer supporting unit 54 has to be washed, or otherwise properly cleaned.

According to the present invention, an identification mark is provided at an appropriate position on the wafer supporting unit 54. The identification mark stores (records) information about the supporting unit (tray ID) including identification of the wafer supporting unit 54. The information about the supporting unit is recorded by an etching process using an electron beam and the like on the surface of the wafer supporting unit 54.

Then, every time the wafer supporting unit 54 supporting the wafer 22 is conveyed, fixed to the magnetic chuck 57, and a wafer process (not shown) is performed, the information stored in the identification mark is read by a sensor, and the wafer supporting unit 54 is identified. The identification information of the wafer supporting unit 54 read by the sensor is provided to a computer, and a cumulative value of the usage count for the wafer supporting unit 54 is recorded (not shown).

If the usage count of the wafer supporting unit 54 reaches a predetermined value, for example, 100 times, the computer issues a washing direction, and the wafer supporting unit 54 is washed. Henceforth, washing is repeated for every 100 usage counts. Furthermore, if the cumulative usage count reaches a predetermined value, for example, 1000 times, the wafer supporting unit 54 is replaced.

Since according to the management method of the wafer supporting unit explained above, the identification mark including the identification of the supporting unit is provided on the wafer supporting unit 54, the contamination state of the wafer supporting unit is properly managed, and the contamination substance adhering to the wafer supporting unit is prevented from adhering to the wafer.

In addition, as for information other than the identification of the wafer supporting unit stored in the above-mentioned identification mark, information on a processing wafer, a process, and so on can be included as required.

THE ADVANTAGE OF INVENTION

As for the wafer supporting unit according to the present invention, the thermally conductive member is made from a thermally conductive rubber in which (1) a thermally conductive granular material is densely distributed in pillar-shaped regions that connect the wafer placement side and the base side of the thermally conductive member, (2) a thermally conductive fiber material is uniformly distributed, and (3) the thermally conductive fiber material is densely distributed in pillar-shaped regions that connect the wafer placement side and the base side of the thermally conductive member, and in this manner, curvature is not produced in the wafer, the wafer is efficiently cooled, and the thermally conductive member is protected from degradation due to the heat.

As for the wafer supporting unit according to the present invention, density distribution of the thermally conductive fiber material in the thermally conductive member is varied. In this manner, high and uniform heat conduction for the entire thermally conductive member is achieved.

Further, as for the wafer supporting unit according to the present invention, the thermally conductive granular material or the thermally conductive fiber material, as the case may be, is blended into the thermally conductive member such that the thermally conductive granular material or the thermally conductive fiber material, as applicable, is not exposed at the wafer placement surface of the thermally conductive rubber. In this manner, satisfactory adhesion of the wafer to the thermally conductive rubber can be obtained, the wafer can be cooled more efficiently, and the wafer can be firmly supported on the wafer supporting unit.

Further, as for the wafer supporting unit according to the present invention, the thermally conductive member is made smaller than the wafer by an amount equal to or greater than the positioning error that can occur when the wafer is placed on the thermally conductive member. In this manner, at the time of wafer processing, there is no possibility of a processing material, for example, etching material, being directly applied to the thermally conductive member, thereby protecting the thermally conductive member from deteriorating.

Further, as for the wafer supporting unit according to the present invention, the thermally conductive member and the wafer are arranged in a concavity prepared in the base. In this manner, the side of the wafer and the thermally conductive member are protected from plasma and radicals, when performing a wafer process.

Further, as for the wafer supporting unit according to the present invention, the surface of the base is covered by a ceramic material, so that the base is also protected from plasma and radicals.

Further, as the wafer supporting unit according to the present invention, a predetermined size of the base is used for different thermally conductive members corresponding to different sizes of wafers. In this manner, wafers of different sizes can be handled by the same production apparatuses, such as a conveyer apparatus and a fixing apparatus, eliminating the need for preparing multiple sets of production apparatuses, such as conveyer apparatuses and fixing apparatuses.

Further, as for the wafer supporting unit according to the present invention, an identification mark for storing predetermined information is prepared. In this manner, a contamination state of the wafer supporting unit can be properly managed such that the contamination of the wafer by contamination substances adhering to the wafer supporting unit can be prevented from occurring.

What is claimed is:

1. A wafer supporting unit, which comprises
a thermally conductive member that further comprises a thermally conductive rubber, provided on a base for arranging a wafer on said thermally conductive member,
wherein said thermally conductive rubber of said thermally conductive member comprises a plurality of pillar-shaped regions wherein thermally conductive material is provided,
said pillar-shaped regions connecting a first surface of said thermally conductive rubber, said first surface touching said wafer, and a second surface of said thermally conductive rubber, said second surface touching said base,
wherein said thermally conductive material is distributed in said thermally conductive rubber of said thermally conductive member with a density variation in a direction corresponding to the radius direction of said wafer that is placed on said first surface.

2. The wafer supporting unit as claimed in claim 1, wherein said thermally conductive material is not exposed at said first surface of said thermally conductive rubber of said thermally conductive member.

3. The wafer supporting unit as claimed in claim 1, wherein said first surface of said thermally conductive member is formed in the shape of a circle, and the diameter of said thermally conductive member is set smaller than the diameter of said wafer by an amount that is greater than a positioning error that occurs when said wafer is placed on said wafer supporting unit.

4. The wafer supporting unit as claimed in claim 1, wherein an identification mark is provided for recording predetermined information.

5. The wafer supporting unit as claimed in claim 1, wherein the thermally conductive material of the pillar-shaped regions includes high density composition of thermally conductive granular material.

6. A wafer supporting unit, which comprises
a thermally conductive member that further comprises a thermally conductive rubber for arranging a wafer on said thermally conductive member,
wherein said thermally conductive rubber of said thermally conductive member comprises thermally conductive material that is distributed in said thermally conductive rubber,
wherein said thermally conductive material is distributed in said thermally conductive rubber of said thermally conductive member with a density variation in a direction corresponding to the radius direction of said wafer that is placed on a first surface of said thermally conductive rubber, said first surface touching said wafer.

7. The wafer supporting unit as claimed in claim 6, wherein said thermally conductive material is not exposed at a surface of said thermally conductive rubber of said thermally conductive member, said surface being the surface on which said wafer is placed.

8. The wafer supporting unit as claimed in claim 6, wherein said thermally conductive material is a fibrous material.

9. A wafer supporting unit, which comprises
a thermally conductive member that further comprises a thermally conductive rubber for arranging a wafer on said thermally conductive member,
wherein said thermally conductive rubber of said thermally conductive member comprises thermally conductive material that is distributed in said thermally conductive rubber,
wherein said thermally conductive material is distributed at high density in said thermally conductive rubber of said thermally conductive member such that a plurality of pillar-shaped regions are formed,
said pillar-shaped regions connecting a first surface of said thermally conductive rubber, said first surface touching said wafer, and a second surface of said thermally conductive rubber, said second surface touching a base for arranging said wafer,
wherein said thermally conductive material is distributed in said thermally conductive rubber of said thermally conductive member with a density variation in a direction corresponding to the radius direction of said wafer that is placed on said first surface.

10. The wafer supporting unit as claimed in claim 9, wherein said thermally conductive material is not exposed at said first surface of said thermally conductive rubber of said thermally conductive member.

11. The wafer supporting unit as claimed in claim 9, wherein said thermally conductive material is a fibrous material.

12. A wafer supporting unit, which comprises
a thermally conductive member that further comprises a thermally conductive rubber, provided on a base for arranging a wafer on said thermally conductive member,
wherein said thermally conductive rubber of said thermally conductive member comprises a plurality of pillar-shaped regions wherein thermally conductive material is provided,
said pillar-shaped regions connecting a first surface of said thermally conductive rubber, said first surface touching said wafer, and a second surface of said thermally conductive rubber, said second surface touching said base,
wherein a concavity in the shape of a cylinder is prepared in said base for arranging said thermally conductive member in said concavity, and for further arranging said wafer in said concavity,
wherein the surface of said base is covered by ceramic material, except at least for a part of the surface which is covered by said thermally conductive member.

13. The wafer supporting unit as claimed in claim 12, wherein external dimensions of said base are common to different sizes of thermally conductive members corresponding to different sizes of wafers to be arranged.

14. The wafer supporting unit as claimed in claim 12, wherein the thermally conductive material of the pillar-shaped regions includes high density composition of thermally conductive granular material.

* * * * *